United States Patent [19]

Shimizu et al.

[11] Patent Number: 5,041,014

[45] Date of Patent: Aug. 20, 1991

[54] ELECTRONIC DEVICE HAVING A PAIR OF ELECTRICALLY CONNECTED INSULATING FILM COATED COVERS

[75] Inventors: Hisashi Shimizu; Ikuo Ito, both of Tokyo, Japan

[73] Assignee: Kabushiki Kaisha Toshiba, Kawasaki, Japan

[21] Appl. No.: 607,749

[22] Filed: Oct. 31, 1990

Related U.S. Application Data

[63] Continuation of Ser. No. 459,540, Jan. 5, 1990, abandoned.

[30] Foreign Application Priority Data

Jan. 12, 1989 [JP] Japan ................................. 1-3748

[51] Int. Cl.$^5$ ............................................. H01R 4/24
[52] U.S. Cl. ..................................................... 439/433
[58] Field of Search ................................ 439/389–439

[56] References Cited

U.S. PATENT DOCUMENTS 3,626,357  12/1971  Kindell et al. ............... 439/433
3,914,001  10/1975  Nelson et al. ............... 439/433

FOREIGN PATENT DOCUMENTS 0262794   4/1988   European Pat. Off. .
2826092  12/1978   Fed. Rep. of Germany .
3313970  10/1984   Fed. Rep. of Germany .

*Primary Examiner*—Joseph H. McGlynn
*Attorney, Agent, or Firm*—Cushman, Darby & Cushman

[57] ABSTRACT

An electronic device comprises a first outer cover, a second outer cover and joining means. The first outer cover has a first insulator covering the surface of a first conductor having a through hole formed therein. The second outer cover, which is disposed in contact with the through hole, has a second conductor covered with a second insulator. The joining means has a conductivity and is adapted to be inserted in the through hole to be electrically coupled to the second conductor. When inserted in the through hole, the joining means penetrates the first insulator around the outer wall of the hole and comes in electric contact with the first insulator, thereby permitting the first and second outer covers to be electrically connected and form an electric wave shielding cover as a consequence.

2 Claims, 3 Drawing Sheets

ELECTRONIC DEVICE HAVING A PAIR OF ELECTRICALLY CONNECTED INSULATING FILM COATED COVERS

This is a continuation of application Ser. No. 07/459,540, filed on Jan. 5, 1990, which was abandoned upon the filing hereof.

BACKGROUND OF THE INVENTION

1. Field of the Invention

The present invention relates to an electronic device which comprises a pair of electrically connected insulating-film coated covers each having a conductor covered with an insulator.

2. Description of the Related Art

Conventionally, an outer cover having a conductivity is used in electronic devices for shielding an electric wave. To provide this outer cover with the conductivity, copper, stainless steel or the like in a fiber form is mixed in the material for the cover. However, the outer cover inevitably has such a fiber material covered with a resin material during a cover forming process.

In an electronic device comprising top and bottom outer covers of the above type, therefore, simple assembling of these two outer covers cannot shield an electric wave due to its electric connection being cut off.

To electrically connect the two outer covers, there is a conventional method to remove the resin material from the surfaces from the contacting portions of the outer covers. The resin material can be removed by melting it through some chemical treatment or cut away by a cutter. Alternately, the top and bottom outer covers may be electrically connected by means of connection terminals provided on these covers. The former method of removing the resin material from the proper portions of the outer covers, however, takes a significant time and is likely to deteriorate the appearance of the electronic device. The alternate solution involving the connection terminals requires some space for attaching such terminals and is thus a bottleneck to making electronic devices more compact.

SUMMARY OF THE INVENTION

Accordingly, it is an object of this invention to provide an electronic device comprising a pair of electrically connected insulating-film coated covers, which device facilitates electrical connection of these insulating-film coated covers.

The above object is achieved by providing an electronic device which comprises a first outer cover, a second outer cover and joining means. The first outer cover has a first insulator covering the surface of a first conductor having a through hole formed therein. The second outer cover, which is adapted to be put on the first outer cover, has a second conductor covered with a second insulator. The joining means has a conductivity and is adapted to be inserted in the through hole to be electrically coupled to the second conductor. When inserted in the through hole, the joining means penetrates the first insulator around the hole and comes in electric contact with the first insulator, thereby permitting the first and second outer covers &o be electrically connected and form an electric wave shielding cover as a consequence.

DESCRIPTION OF THE PREFERRED EMBODIMENT

A preferred embodiment of this invention will now be described referring to the accompanying drawings.

Figure 1:
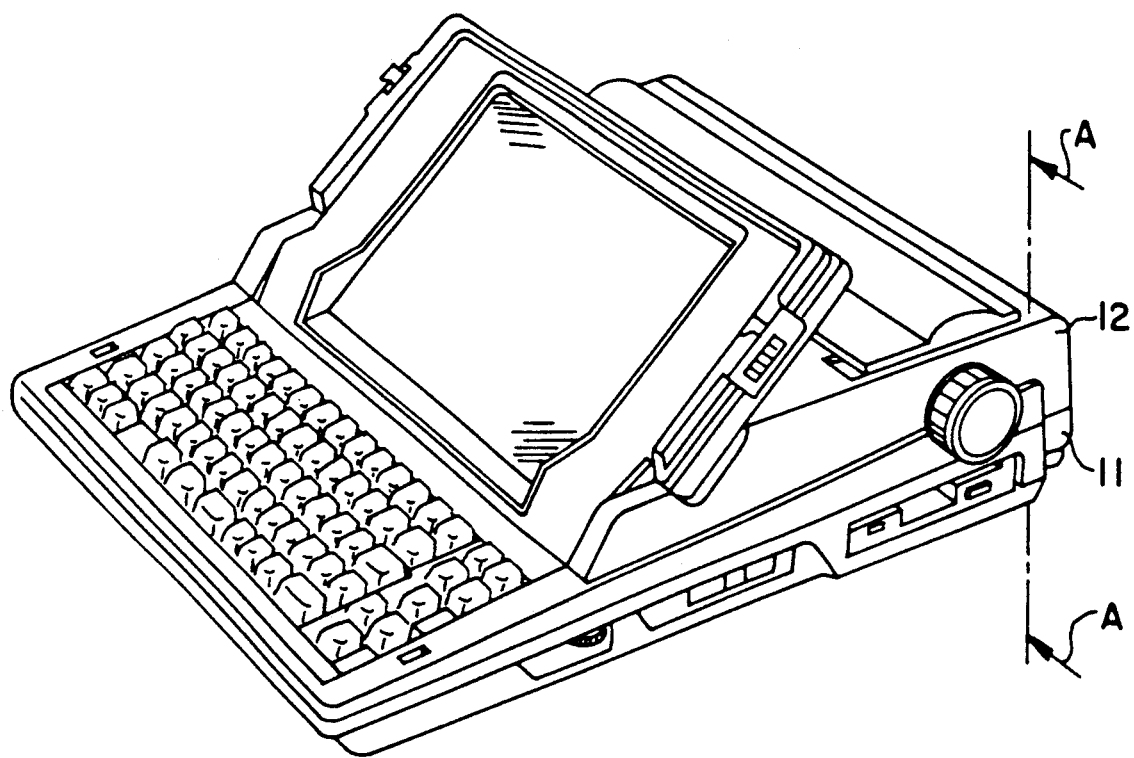
FIG. 1 is a perspective view of one embodiment of the present invention.

FIG. 1 is a perspective view illustrating an electronic device according &o one embodiment of the present invention. The electronic device comprises a first outer cover 11 and a second outer cover 12 for shielding an electric wave , for example. These covers 11 and 12 cover and protect electronic parts disposed in the electronic device, such as a base board and connector cables.

Figure 2:
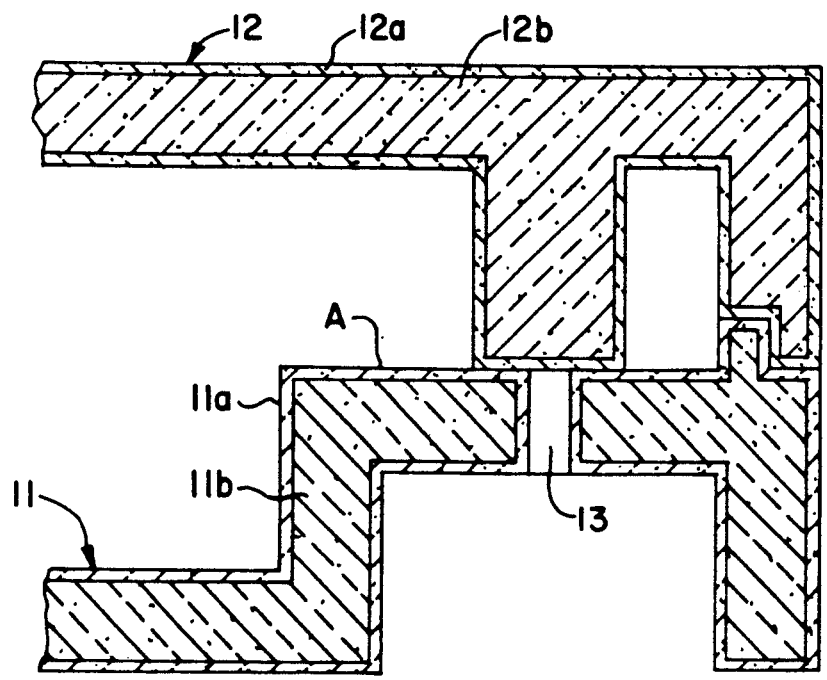
FIGS. 2 through 4 are cross-sectional views taken along the line A—A in FIG. 1 and illustrating where first and second outer covers are connected, FIG. 3 illustrating joining means being inserted in a through hole and FIG. 4 illustrating the joining means being screwed into a second conductor.
Figure 3:
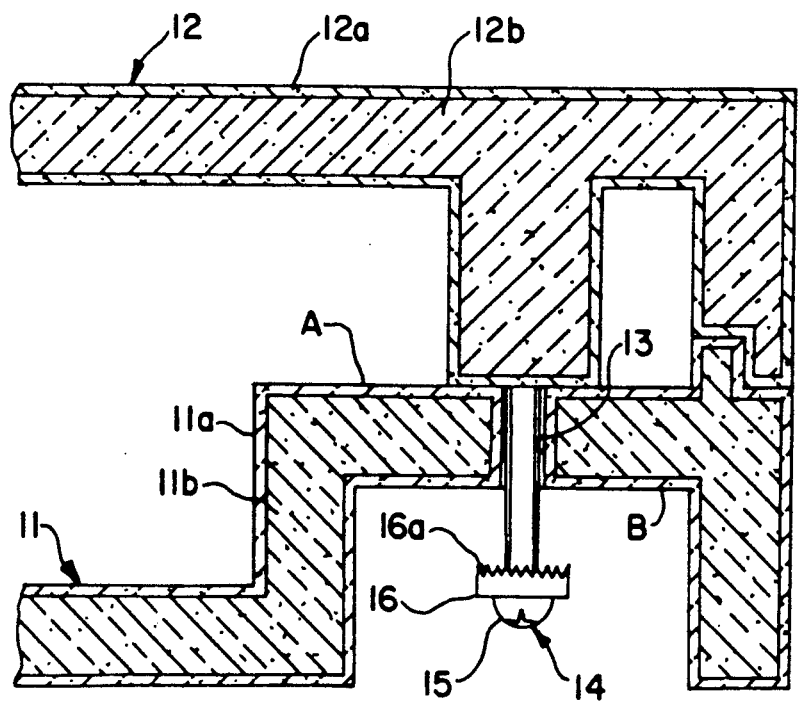
Figure 4:
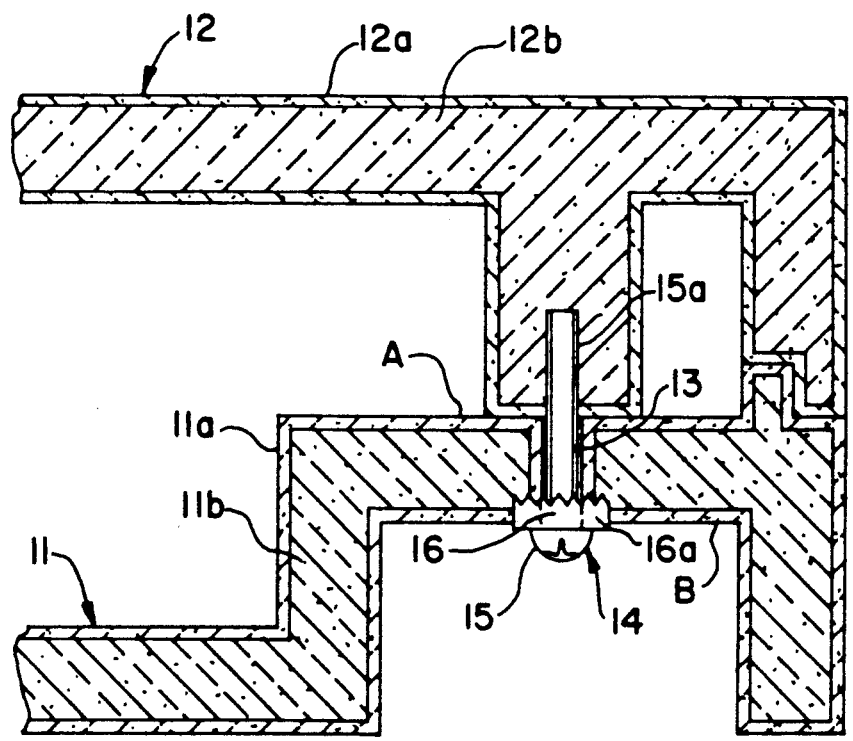

FIGS. 2 through 4 are cross-sectional views taken along the line A—A in FIG. 1, which illustrate where the first and second outer covers 11 and 12 are connected. Referring &o FIG. 2, the first outer cover 11 is onstituted by covering the surface of a first conductor 11b with a first insulator 11a; the first conductor has a through hole 13 formed therein. The second outer cover 12, disposed in contact with the through hole 13 of the first outer cover 11 (on the side of the surface A in the diagram), is constituted by covering the surface of a second conductor 12b with a second insulator 12a. The first and second conductors 11b and 12b are formed by mixing copper, stainless steel or the like in a fiber form in a resin material or the like, so that they become conductive. The first and second insulators 11a and 12a are formed by a resin material or the like.

A description will now be given of how to electrically connect the first and second outer covers 11 and 12. FIG. 3 illustrates joining means 14 being inserted in the through hole 13 and FIG. 4 illustrates the joining means beig screwed into the second conductor 12b. Referring to FIG. 3, the joining means 14 comprises a conductive first joining portion 15 such as a screw (hereinafter referred to as screw 15) and a second joining portion 16 such as a washer (hereinafter referred to as washer 16). The screw 15 is adapted to be inserted in the through hole 13 of the first outer cover 11 to come in contact with the second insulator 12a of the second outer cover 12. The washer 16 has a plurality of, for example, projections 16a formed on one surface which comes in contact with the first insulator 11a (on the side of the surface B in the diagram) around the peripheral portion of the through hole 13. The screw 15 peneterates the washer 16.

The operation of the present invention will now be described.

As shown in FIG. 4, the screw 15 inserted in the through hole 13 of the first outer cover 11 is tightened. As a free or distal end 15a of the screw 15 is driven into the second conductor 12b of the second outer cover 12, the projections 16a formed on one surface of the washer 16 cut into the first insulator 11a of the first outer cover 11 around the through hole 13 (on the side of the surface B in FIG. 4). Further tightening the screw 15 enforces those projections 16a of the washer 16 to penetrate the first insulator 11a and cut into the first conductor 11b. This electrically connects the first and second conductors 11b and 12b through &he screw 15 and washer 16.

Through the above assembling, the first and second outer covers 11 and 12 form an electric-wave shielding cover.

Although the foregoing description has been given with reference to the method of electrically connecting the first and second outer covers 11 and 12 by means of the screw 15 and washer 16, these covers may be electrically connected by joining means having the screw 15 and washer 16 formed integrally according to another embodiment. This joining means can eliminate the otherwise necessary operation by a worker to assemble the screw 15 and washer 16 together at the time the first and second outer covers 11 and 12 are put together.

What is claimed is;

1. An electronic device for electrically connecting a pair of insulating-film coated covers, said device comprising:

a first outer cover having a first insulator covering a surface of a first conductor having a through hole formed therein;

a second outer cover adapted to be put on said first outer cover and having a second conductor covered with a second insulator; and joining means having a conductivity and adapted to be inserted in said through hole to penetrate said first insulator around said through hole to thereby be electrically coupled to said second conductor and embedded in said second conductor.

2. An electronic device according to claim 1, wherein said joining means includes:

conductive first joining means adapted to be inserted in said through hole to be embedded in said second conductor; and second joining means having a plurality of projections formed on that surface thereof which is electrically connected to said first joining means to come in contact with said first insulator around said through hole.

* * * * *